(12) United States Patent
Amann et al.

(10) Patent No.: US 11,942,316 B2
(45) Date of Patent: Mar. 26, 2024

(54) APERTURE DEVICE AND ANALYZER ARRANGEMENT

(71) Applicant: Scienta Omicron AB, Uppsala (SE)

(72) Inventors: Peter Amann, Åkersberga (SE); Anders Nilsson, Stockholm (SE)

(73) Assignee: Scienta Omicron AB, Uppsala (SE)

( * ) Notice: Subject to any disclaimer, the term of this patent is extended or adjusted under 35 U.S.C. 154(b) by 308 days.

(21) Appl. No.: 17/311,264

(22) PCT Filed: Dec. 6, 2019

(86) PCT No.: PCT/SE2019/051240
§ 371 (c)(1),
(2) Date: Jun. 4, 2021

(87) PCT Pub. No.: WO2020/117122
PCT Pub. Date: Jun. 11, 2020

(65) Prior Publication Data
US 2022/0020580 A1    Jan. 20, 2022

(30) Foreign Application Priority Data

Dec. 7, 2018  (SE) .................................... 1851526-2
Apr. 9, 2019  (SE) .................................... 1950444-8

(51) Int. Cl.
*H01J 49/06* (2006.01)
*H01J 37/08* (2006.01)

(52) U.S. Cl.
CPC ............ *H01J 49/067* (2013.01); *H01J 37/08* (2013.01); *H01J 2237/006* (2013.01); *H01J 2237/188* (2013.01); *H01J 2237/2855* (2013.01)

(58) Field of Classification Search
CPC ........ H01J 37/08; H01J 37/026; H01J 37/285; H01J 37/3056; H01J 2237/006;
(Continued)

(56) References Cited

U.S. PATENT DOCUMENTS

2009/0152460 A1* 6/2009 Buhler ................ H01J 37/3056
                                                       250/306
2011/0186719 A1* 8/2011 Phaneuf ................ H01J 37/026
                                                       250/251

OTHER PUBLICATIONS

International Search Report and Written Opinion received for International Patent Application No. PCT/SE2019/051240 dated Jun. 25, 2020, 20 pages.
(Continued)

*Primary Examiner* — David E Smith
*Assistant Examiner* — Hsien C Tsai
(74) *Attorney, Agent, or Firm* — Morrison & Foerster LLP

(57) ABSTRACT

An aperture device (31) is described, which is attachable to a lens system (13). The lens system (13) is arranged to form a particle beam of charged particles, emitted from a sample surface (Ss). The aperture device (31) comprises an end surface (S) which is to be arranged facing the sample surface (Ss), at least one aperture (38) arranged in the end surface (S), a length axis (32) which extends through the centre of said at least one aperture (38), and at least one gas outlet (10), which is arranged at a transverse distance (T) perpendicular from the length axis (32), and is arranged to direct gas into a volume between at least one aperture (38) and the sample surface (Ss). The end surface (S) within a distance, equal to ⅓ of the transverse distance (T), perpendicular from the length axis (32) has a variation along the length axis (32) being smaller than ⅙ of the transverse distance (T).

20 Claims, 6 Drawing Sheets

(58) Field of Classification Search
CPC ......... H01J 2237/0041; H01J 2237/188; H01J 2237/2605; H01J 2237/2855; H01J 2237/31744; H01J 2237/31732; H01J 2237/31749; H01J 49/067; H01J 49/484
See application file for complete search history.

(56) References Cited

OTHER PUBLICATIONS

Invitation to Pay Additional Fees and Partial Search Report and Opinion received for International Patent Application No. PCT/SE2019/051240 dated Feb. 27, 2020, 13 pages.

* cited by examiner

APERTURE DEVICE AND ANALYZER ARRANGEMENT

CROSS REFERENCE TO RELATED APPLICATIONS

This application is a national stage application under 35 U.S.C. § 371 of International Application No. PCT/SE2019/051240, filed internationally on Dec. 6, 2019, which claims priority to SE 1950444-8, filed Apr. 9, 2019, which claims priority to SE1851526-2, filed Dec. 7, 2018, the entire contents of each are incorporated herein by reference.

TECHNICAL FIELD

The present invention relates to an aperture device and an analyser arrangement for analysing e.g. the energies, the start directions, the start positions and the spin of charged particles emitted from a particle emitting sample. In particular, the present invention relates to an aperture device and an analyser arrangement for use in a photo-electron spectrometer of the hemispherical deflector type. More specifically, the present invention relates to an aperture device and an analyser arrangement for photoelectron spectroscopy at pressures as high as a few bars.

BACKGROUND ART

In the prior art systems for Ambient Pressure Photoemission Spectroscopy (APXPS) and Ambient Pressure Photo Emission Spectroscopy (APPES) a high pressure is provided at a sample while radiating the sample to provide, e.g., photoelectrons or electrons originating from Auger processes. The photoelectrons are collected in an electrostatic lens system which is differentially pumped. The electrostatic lens system focuses the electrons to an entrance to a measurement region. To enable a high vacuum in the electrostatic lens system the aperture into the electrostatic lens system has to be small.

In prior art APPES is performed in three ways; 1) a sample is put in a chamber and the whole chamber is raised to ambient pressures in the mbar range, this is known as the backfill approach; 2) is a variant of the backfill approach where different chambers are used for different set of experiments and the chambers are exchanged, hence this method is called the exchangeable chamber approach; and 3) an in situ gas cell encapsulate the sample with the front aperture of the analyser. All these tree versions could be operated in flow mode, where the gas is let in and simultaneously pumped out via an outlet or the gas is only pumped out via the front cone and the pumping arrangement of the analyser.

A problem with using an in situ cell in a surrounding vacuum chamber is that each in situ cell has to be provided with a window, enclosing the atmosphere in the cell with respect to the outer chamber to allow electromagnetic radiation to reach the sample. The sample needs to be manoeuvred and/or heated inside the cell. Also, pressure reading etc. has to be incorporated into the cell. Furthermore, the cell needs to be situated on a manipulator with a sufficient travel to remove the cell from the outer vacuum chamber in order to facilitate vacuum measurements, i.e. the cell has to be situated on a long manipulator with high requirements on alignment. The in situ cell solution is complex and needs to be a confined space that allow mbar operation without leaking to the UHV chamber surrounding the in situ cell. If light for, e.g., a camera is to be transferred into or out of the cell there needs to be a window in the cell. If the pressure is to be elevated to the region of bar instead of a few mbar the demands on the window increases. All in all this makes the cells complex and therefore expensive. Also, the change of samples might be difficult when using in situ cells.

The arrangement of the sample directly in the vacuum chamber facilitates the exchange of samples. However, it limits the available pressure to around 1 bar as most vacuum chambers are not designed to handle overpressure. Also, there is a problem with contamination of the chamber in which the sample is arranged. The contamination is caused by different compounds such as products from, e.g., a chemical process in the sample. The compounds from one experiment may stick to the walls of the chamber. Contaminations originating from the chamber wall can reach the sample surface in a subsequent experiment.

A variant of the gas cell method is described in J. Knudsen et al. "A versatile instrument for ambient pressure x-ray photoelectron spectroscopy: The Lund cell approach", Surface Science 646 (2016) 160-169. Here Knudsen et al. describes an alternative ambient pressure cell in which a gas flow is directed at the sample. Gas outlets are arranged surrounding the aperture used for collecting electrons to the detector.

When performing APPES it is necessary to have the sample arranged close to the aperture. The reason for this is that the mean free path for electrons is short for high pressures. As an example, a desirable distance between the sample surface and the aperture is 30 µm for XPS in carbon monoxide at a pressure of 1 bar, since the mean free path for 10 keV electrons in carbon monoxide at 1 bar pressure is about 30 µm. Thus, a distance of 30 µm would enable a reasonable part of the photoelectrons to pass into the aperture. For such distances between the sample and the aperture it is very difficult to measure or predict the pressure at the sample surface. This is especially true when the pressure at the sample is provided by a flow of gas directed towards the sample surface. It would be of interest to perform XPS at pressures of 1 bar and above. Examples of interesting reactions to be studied include hydrogenation reactions, which takes place at 10-30 bar, and ammonia production, which takes place at 100 bar.

The general prior art of pressure estimation originates from Ogletree et al. (Ogletree 2002, Rev. Sci. Instrum. 73, 3872), where the pressure profile between the sample chamber and electrostatic lens chamber through an aperture is estimated using a simple analytical function. The pressure profile is also discussed in H. Bluhm, "J. Electron. Spectrosc. Relat. Phenom., 177 (2010), 71-84", and in J. Kahk et al. "J. Electron. Spectrosc. Relat. Phenom., 205 (2015) 57-65". In said articles it is estimated that the pressure at the sample surface is 95% of the pressure measured in the sample chamber with a distance of 1 aperture diameter between the sample surface and the aperture and 98% of the pressure measured in the sample chamber with a distance of 2 aperture diameters between the sample surface and the aperture. Kahk et al. have also calculated that the pressure at the sample surface is varying with pressure. The higher the pressure the more accurate the pressure reading for 1 diameter distance, but for low pressures 2 diameters will be more accurate.

SUMMARY OF THE INVENTION

An object of the present invention is to provide an aperture device and an analyser arrangement with such an aperture device, which at least alleviates the problems with the prior art.

Another object of the present invention is to provide an aperture device and an analyser arrangement with such an aperture device, which enables ambient pressure x-ray photoelectron spectroscopy without the need for an in situ cell.

Another object of the present invention is to provide an aperture device and an analyser arrangement with an aperture device, with which it is possible to provide a local high pressure region in a vacuum chamber and with which a quick sample exchange is possible.

Another object of the present invention is to provide a method for forming a high pressure between an aperture to a lens system of an analyser arrangement and a sample surface of a particle emitting sample.

At least one of these objects is fulfilled with an aperture device, an analyser arrangement or a method according to the independent claims.

Further advantages are achieved by means of the features of the dependent claims.

According to a first aspect of the present invention an aperture device is provided which is attachable to a lens system, comprising a first end and a second end at a distance from the first end, wherein the lens system is arranged to form a particle beam of charged particles, emitted from a sample surface of a particle emitting sample, which enter the lens system at the first end and to transport the charged particles to the second end. The aperture device comprises an end surface which is to be arranged facing the sample surface, at least one aperture arranged in the end surface for allowing at least a part of said particles to enter the lens system when the aperture device is attached to the lens system, and a length axis which extends through the centre of said at least one aperture and is essentially perpendicular to the end surface. The aperture device is characterized in that the aperture device comprises at least one gas outlet, which is arranged at a transverse distance perpendicular from the length axis, and which is arranged to direct gas, into a volume between the at least one aperture and the sample surface. The aperture device within a distance of less than 10 times the transverse distance, perpendicular from the length axis comprises gas flow constriction means, to constrain the flow of gas from the volume between the at least one aperture and the sample surface.

The aperture device according to the invention dispenses with the need for an in situ cell according to the prior art. Thus, the standard UHV window equipment and equipment used for backfilling APPES can be used even for higher pressure applications. The advantages of a local pressure such as is present in a gas cell, may be combined with the ease of use of an open chamber solution.

Said at least one gas outlet enables a high-pressure region to be formed in the volume between the at least one aperture and the sample surface, by supplying gas from the at least one gas outlet.

Furthermore, the gas outlet enables a flow of gas over the sample that would prevent contamination, which could be the case in non-flow systems like backfilling chambers etc.

With the aperture device according to the first aspect the sample holder does not have to be linked to the aperture device as is the case in the prior art solutions. This make the use of cameras and other equipment easier and also lowers the complexity of the setup.

A length axis extends through the centre of said at least one aperture as defined above. In case the aperture device comprises a plurality of apertures, the length axis is centred in relation to the apertures. In case the aperture device comprises a plurality of apertures all apertures are preferably arranged no further from the length axis than the gas outlet.

Said at least one gas outlet is preferably directed partly towards the length axis. This is favourable to provide a high pressure at the sample close to the length axis.

The constriction means may be arranged in the end surface and comprise a constriction surface at a constriction distance perpendicular from the length axis, which constriction surface, seen along the length axis, encircles the at least one gas outlet and the at least one aperture. At least 75% of constriction surface has a deviation along the length axis in relation to the end surface at the at least one aperture being smaller than the square of the transverse distance divided by the constriction distance (X), i.e. $Y<T^2/X$, and preferably smaller than the square of the transverse distance (T) divided by 10 times the constriction distance (X), i.e. $Y<T^2/10X$.

Preferably, the constriction surface encircles 100% of the at least one gas outlet and the at least one aperture. Thus, gas which flows from the volume between the at least one aperture and the sample surface must pass the constriction surface. As the constriction is at a level close to the level of the aperture a small distance between the aperture and the sample will result in a small distance between the constriction surface and the sample surface. Preferably, the constriction surface and the end surface at the aperture are at the same level along the length axis. This will result in the same distance between the aperture and the sample surface as the distance between the constriction surface and the sample surface. This decreases the flow from the volume between the aperture and the sample surface for a given constriction distance.

The constriction distance may be smaller than 2 times the transverse distance. By having the constriction distance no larger than 2 times the transverse distance it is possible to direct radiation to the sample surface opposite to the aperture between the constriction surface and the sample surface without making the incident angle of the radiation excessively small. If the constriction distance is between 2 and 10 times the transverse distance, it is possible to arrange a window in the aperture device which transmits photons of the energy that is to be used.

The end surface within a distance, equal to ⅓ of the transverse distance, perpendicular from the length axis, may have a variation along the length axis being smaller than ⅙ of the transverse distance.

This type of constriction may be used as an alternative to or in combination with the previously described constriction means.

With a shape of the end surface according to the first aspect of the invention the aperture end of the lens system is obtuse. When a sample with a sample surface is arranged facing said obtuse end of the lens system, a volume is formed which is partly enclosed by the end surface and the sample surface. When gas is supplied into said volume, a higher pressure may be achieved in said volume than in the environment surrounding the lens system.

Another advantage of having a supply of gas into the volume between the end surface and the sample surface is that the gas has a cooling effect. This may be important for applications in which the temperature of the sample is very high. An example of such an application is a catalyse reaction in which the sample is heated to a temperature as high as 1000° C. The flow of gas prevents heating of the end surface with the aperture device to a similar temperature. The effect of the cooling may be regulated by regulating the temperature of the gas from the gas outlet.

A factor effecting the pressure that is achievable in the volume between the sample surface and the end surface, is the distance between the sample surface and the end surface.

This distance may, however, not be made infinitely small as that will limit the possible angle of incident for radiation used for the creating the photoelectrons from the sample. Also, a gap which is too narrow will decrease the pressure at the sample surface as it becomes too close to the aperture means. An example of a desirable distance between the sample surface and the end surface/aperture is 30 μm to enable XPS in carbon monoxide at a pressure of 1 bar, since the mean free path for 10 keV electrons in carbon monoxide at 1 bar pressure is about 30 μm according to theoretical calculations. Thus, a distance of 30 μm would enable a reasonable part of the photoelectrons to pass into the aperture. In order to provide an angle of incidence of about 2 degrees said transverse distance should be no larger than 0.86 mm for a completely flat end surface. A slight curvature or slope of the end surface is possible without losing the function of enabling a high pressure zone. Due to the small volume between the at least one aperture and the sample surface, the flow of gas that enters the space can be very limited while still being able to provide a sufficient pressure at the sample. For pressures higher than 1 bar an even shorter distance than 30 μm may be needed. It might be necessary to get as close as 5-10 μm.

Preferably, the lens system and the sample are to be arranged in a vacuum chamber, which is continuously vacuum pumped. This will make it possible to sustain a continuous flow of gas towards the sample with constant pressure at the sample surface. During operation, the gas will diffuse into the surrounding vacuum from the volume between the sample surface and the end surface.

With an aperture device according to the first aspect of the invention, it is possible to achieve a high-pressure region between the aperture and the sample when a gas flow is provided from said at least one gas outlet. From the high-pressure region the gas will flow outwards in the space between the at least one aperture and the sample.

With variation along the length axis is meant the distance between two points on the end surface being farthest away from each other along the length axis. The apertures are of course not part of said surface.

The aperture is arranged to be attached to an end of a lens system arranged within a vacuum chamber. Thus, gas, which leaves the high-pressure region, will flow out in the vacuum chamber from which it is eventually evacuated.

The pressure in the high-pressure region is dependent on a number of factors such as the flow of gas from the gas outlet, the distance between the aperture and the sample, and the shape of the end surface. To be able to achieve a high pressure of about 100-1000 mbar with a reasonable flow of gas for a distance between the sample and the aperture of 200-300 μm, the shape of the end surface should be as defined above.

Said at least one gas outlet may be arranged in the end surface. Such an arrangement of the at least one gas outlet will give a large freedom for the placement of the sample at the aperture as the space opposite to the aperture may be kept free for a sample holder holding the sample. It is, however, also possible to have the at least one gas outlet opposite to the end surface.

The end surface within a distance, equal to 1/3 of the transverse distance, preferably equal to the transverse distance and most preferred equal to 1.5 times the transverse distance, perpendicular from the length axis may have a variation along the length axis being smaller than 1/10 of the transverse distance and preferably smaller than 1/30 of the transverse distance. This will enable an even smaller flow of gas from the at least one gas outlet to achieve a given pressure.

To further lower the necessary gas flow the end surface in at least 75% and preferably at least 90% of the area that is within a distance equal to the transverse distance, perpendicular from the length axis may have a variation along the length axis being smaller than 1/4 of the transverse distance, preferably less than 1/10 of the transverse distance and most preferred smaller than 1/30 of the transverse distance. With such a shape of the end surface the flow of gas from the high-pressure region between the aperture and the sample is further restricted. A smaller variation along the length axis will restrict the maximum flow area outwards from the high-pressure region at a given distance from the length axis. A flatter end surface enables a smaller surface out from the volume between the sample surface and the end surface. A flatter end surface enables a larger pressure difference between the volume between the sample surface and the at least one aperture, and the environment surrounding the lens system for a given supply of gas from said at least one gas outlet.

The aperture device may comprise a number of gas outlets. By having a number of gas outlets an even pressure may be achieved in the high-pressure region by arranging the gas outlets surrounding the at least one aperture.

The gas outlets may be arranged to direct the gas flow at least partly along the length axis. This is advantageous in that a gas flow directly against the sample surface opposite to the aperture provides a high pressure at the sample surface.

The gas outlets may be symmetrically arranged around said at least one aperture, seen along the length axis. A symmetrical arrangement of the gas outlets around the at least one aperture gives a symmetric pressure distribution in the volume between the sample surface and the at least one aperture.

The aperture device may comprise only one gas outlet which surrounds said at least one aperture, seen along the length axis. Such an arrangement of the gas outlet is favourable in that it provides a symmetric pressure distribution in the volume between the at least one aperture and the sample.

The gas outlet may be confined between an inner edge and an outer edge, wherein the outer edge is at a distance along the length axis from the aperture device being smaller than 1/4 of the transverse distance, preferably smaller than 1/10 of the transverse distance and most preferred smaller than 1/30 of the transverse distance. Such an outer edge directs the flow of gas in a favourable way.

The gas outlet may be ring formed, seen along the length axis. Preferably, the ring formed gas outlet is circularly symmetric.

The aperture device may comprise a number of apertures arranged in the end surface. By arranging a number of apertures in the end surface, electrons may be collected from larger area of the particle emitting sample.

The apertures may be arranged along a line in the end surface. Such an arrangement of the apertures is favourable in case the incident radiation, which excites the electrons enters at a small angle as this will lead to an elongated area being irradiated.

Each one of the at least one aperture may be essentially circular. A circular shape is easy to manufacture. Furthermore, most theories regarding flow of gas are based on circular apertures. Thus, established theories for the pressure at the sample surface may be used when the apertures are circular.

The ratio between the distance between adjacent apertures and the diameter of an aperture may be more than 1.5, preferably more than 2 and most preferred more than 3, wherein the distance between the holes is the centre-to-centre distance. This ratio is derived from theoretical calculations. A smaller distance than 1.5 times the diameter of an aperture may, according to theoretical calculations, introduce so-called cross-talk between the apertures.

The diameter of an aperture is less than 200 µm, preferably less than 100 µm, and most preferred, less than 50 µm. The diameter of the aperture determines the minimum achievable distance between the aperture and the sample surface if a high pressure is to be maintained at the sample surface. According to established theories a distance between the sample surface and the aperture being twice the diameter of the aperture enables a pressure at the sample surface of 99% of the pressure at a very large distance from the aperture, when a vacuum is present on the opposite side of the aperture. With large distance is meant a distance from the aperture of at least 10 times the diameter of the aperture. At a distance being equal to the diameter of the aperture the pressure is 95% of the pressure at a large distance from the aperture. Thus, the possible distance between the aperture and the sample surface is approximately equal to the diameter of the aperture to maintain a reasonable pressure at the sample surface. For a very small distance between the sample surface and the aperture, a very small diameter of the aperture is necessary.

According to a second aspect of the present invention, an analyser arrangement is provided for determining at least one parameter related to charged particles emitted from a particle emitting sample. The analyser arrangement comprises a measurement region comprising an entrance allowing at least a part of said particles to enter the measurement region. The analyser arrangement further comprises a lens system comprising a first end, and a second end arranged at the entrance of the measurement region at a distance from the first end. At the first end, the lens system is arranged to form a particle beam from charged particles, emitted from a sample surface of a particle emitting sample, which enter at the first end and to transport the charged particles to the second end. The analyser arrangement also comprises an aperture device according to the first aspect described above, attached to the lens system.

The aperture device in the analyser arrangement may also comprise any of the features described in relation to the first aspect. The aperture device may or may not be an active part of the lens system. By active is meant that the surfaces of the aperture device are included in the formation of the electrical fields responsible for the lens effect.

The analyser arrangement according to the second aspect is primarily an analyser arrangement for photoelectron spectrometry. The photoelectrons are excited using photons of sufficient energy.

It is, however, possible to use an analyser arrangement according to the second aspect of the invention also for mass spectroscopy.

The analyser arrangement may also comprise a chamber surrounding the first end of the lens system and the aperture device and in which the sample is to be arranged and a vacuum pump for pumping vacuum in the chamber.

According to the present invention, a method for forming a high pressure between an aperture to a lens system and a sample surface of a particle emitting sample is provided. The lens system comprises a first end at which the aperture is arranged, and a second end at a distance from the first end, wherein the lens system is arranged to form a particle beam of charged particles, emitted from the sample surface, which enter at the first end and to transport the charged particles to the second end. The method comprises the steps of providing an aperture device, which is attachable to the lens system and comprises an end surface, an aperture arranged in the end surface, a length axis, which extends through the centre of said at least one aperture and is essentially perpendicular to the end surface. The method is characterized in that the method comprises the steps of providing at least one gas outlet in the aperture device at a transverse distance perpendicular from the length axis. The gas outlet is arranged to direct gas into a volume between the at least one aperture and the sample surface. The method also comprises the steps of attaching the aperture device to the lens system with the end surface facing the sample surface, to allow at least a part of said particles to enter the lens system, and to provide a flow of gas from the at least one gas outlet. The aperture device within a distance of less than 10 times the transverse distance, perpendicular from the length axis comprises gas flow constriction means, to constrain the flow of gas from the volume between the at least one aperture and the sample surface. The method also comprises the step of arranging the sample, the aperture device, and the first end of the lens system, in a chamber and pumping vacuum in the chamber.

This is a method of providing a high-pressure volume in a vacuum chamber. The method enables a local high-pressure region to be formed. This dispenses with the need for x-ray transparent windows used in ambient pressure cells of the prior art and allows incident radiation to illuminate the sample surface without having to pass a long distance through gas at high pressure.

The sample surface is arranged at a distance from the end surface of less than 300 µm, preferably less than 100 µm, and most preferred, less than 50 µm. Such distances allows a high pressure region to be formed between the aperture and the sample surface without an excessive flow of gas.

In the following preferred embodiments of the invention will be described with reference to the drawings. The drawings are not drawn to scale. Similar features in the different drawings will be denoted by the same reference numerals.

DETAILED DESCRIPTION

Figure 1:
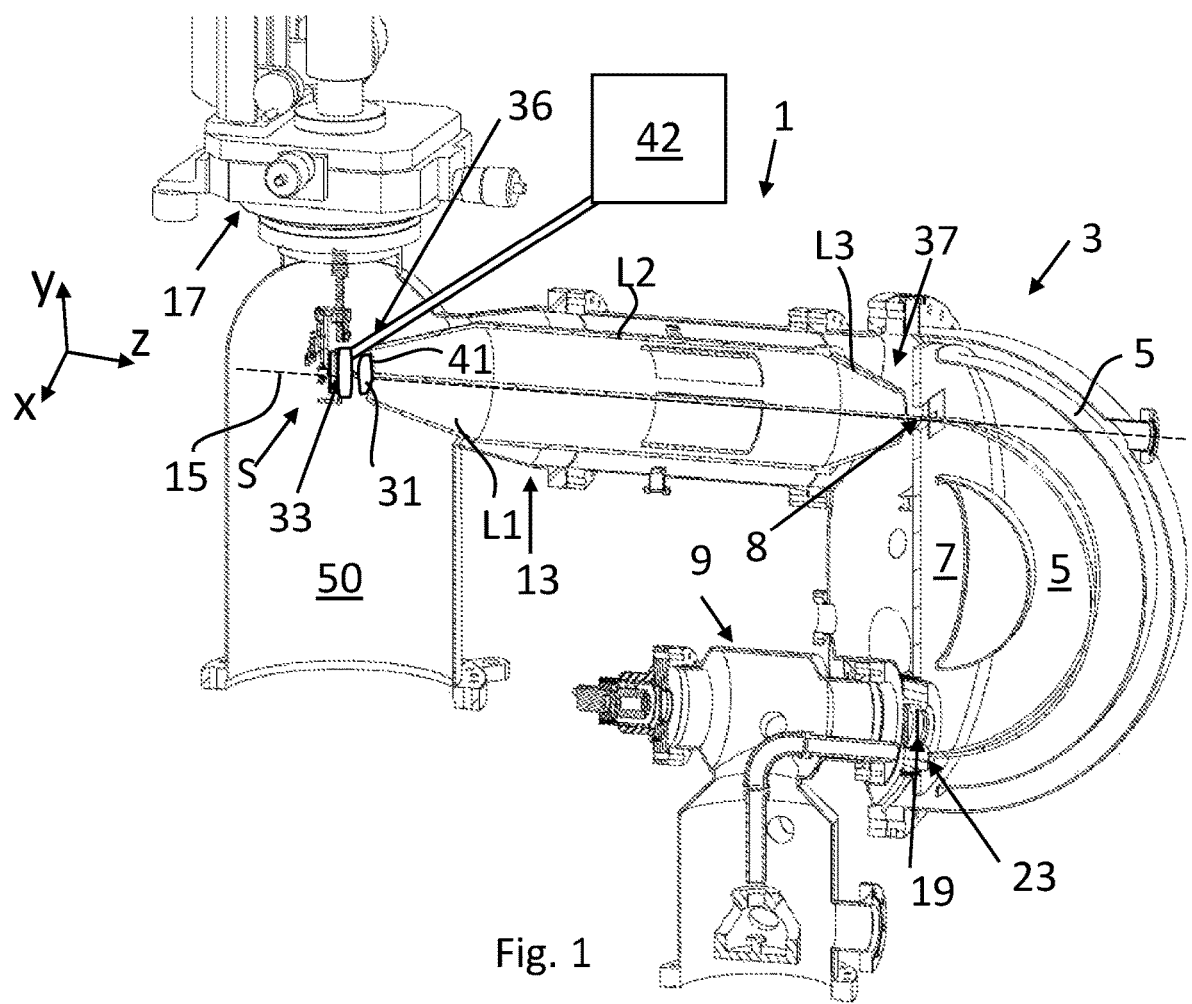
FIG. 1 shows an analyser arrangement according to an embodiment of the present invention.

A analyser arrangement 1 in the form of a photo-electron spectrometer of the hemispherical deflector type, in which an aperture device 31 according to an embodiment of the present invention may be implemented, is illustrated FIG. 1. Thus, FIG. 1 illustrates an analyser arrangement according to an embodiment of the present invention. In the photo-electron spectrometer of the hemispherical deflector type, a central component is the measurement region 3 in which the energies of the electrons are analysed. The measurement region 3 is formed by two concentric hemispheres 5, mounted on a base plate 7, and with an electrostatic field applied between them. The electrons enter the measurement region 3 through an entrance 8 and electrons entering the region between the hemispheres 5 with a direction close to perpendicular to the base plate 7 are deflected by the electrostatic field, and those electrons having a kinetic energy within a certain range defined by the deflecting field will reach a detector arrangement 9 after having travelled through a half circle. In a typical instrument, the electrons are transported from their source (typically a sample 33 with a sample surface Ss (FIG. 2) that emits electrons after excitation with photons, electrons or other particles) to the entrance 8 of the hemispheres by an electrostatic lens system 13. The lens system 13 shown in FIG. 1 comprises an optical axis 15, a first end 36 and a second end 37 at a distance along the optical axis 15 from the first end 36. The lens system 13 is arranged to form a particle beam of charged particles, emitted from the sample surface Ss of the particle emitting sample 33, which enter the lens system 13 at the first end 36 and to transport the charged particles to the second end 37. The lens system 13 also comprises a plurality of lenses L1-L3 having a common and substantially straight optical axis 15. The photoelectrons from the sample surface Ss enters the electrostatic lens system 13 through an aperture device 31 arranged at the first end of the lens system 13.

For the following description, a Cartesian coordinate system with its z-axis along the optical axis 15 of the lens system 13 (in most cases an axis of rotational symmetry) will be used, and with the hemispheres symmetrical with respect to the (y, z) plane. The directions of the electron trajectories are described by their angles $\theta_x$ against the (y, z) plane and $\theta_y$ against the (x, z) plane. The directions x, y, z, are indicated in FIG. 1.

The lens system 13 and the detector arrangement 9 will only accept electrons, which are emitted within a limited area perpendicular to the optical axis 15 and within a limited angular range. Furthermore, the source has to be positioned within a narrow range in the z-direction to achieve the best properties (in terms of sensitivity and resolution). This necessitates mounting the sample on a manipulator 17 allowing both translations and rotations in all coordinate directions, i.e. six degrees of freedom. Also shown in FIG. 1 is a gas supply device 42, which provides pressurized gas to the sample 33.

Figure 2:
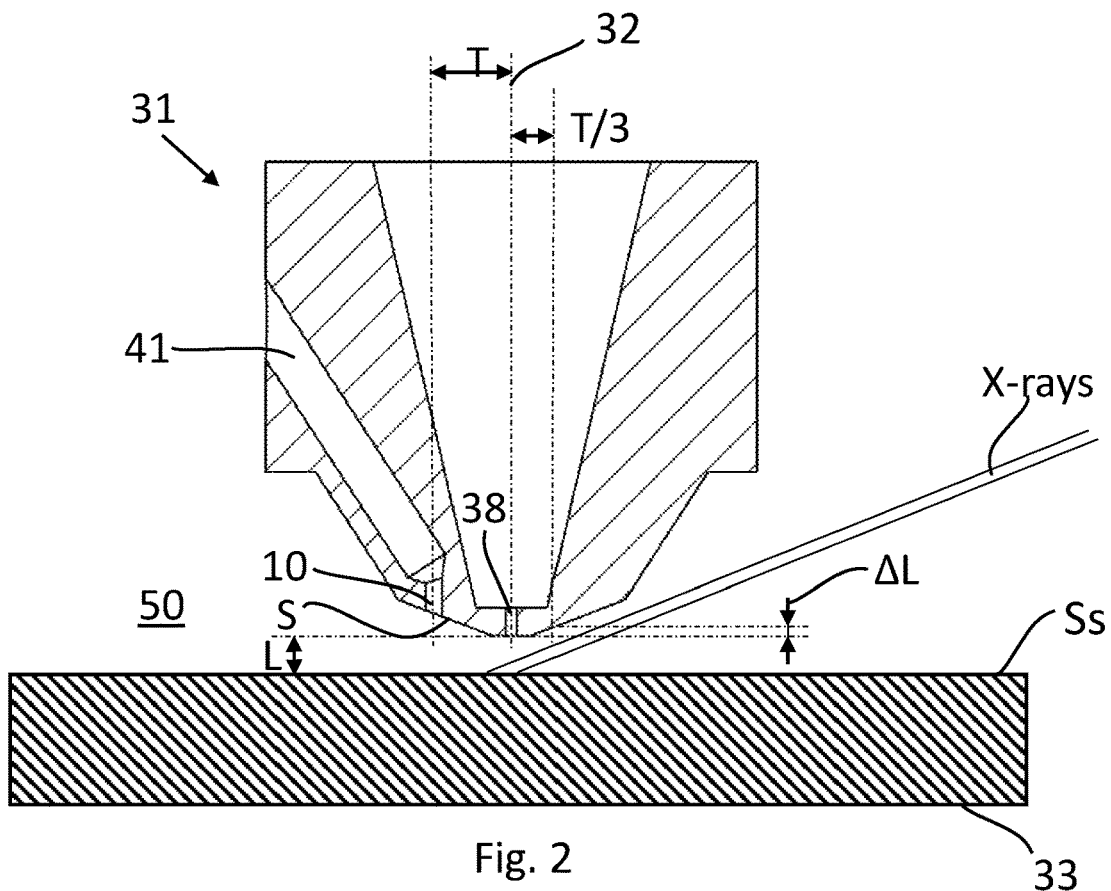
FIG. 2 shows in more detail in cross section the aperture device and the sample of FIG. 1 according to an embodiment of the present invention.

FIG. 2 shows in larger detail the aperture device 31 in cross section. The aperture device 31 is attachable to the lens system 13. The aperture device 31 comprises an end surface S which is to be arranged facing the sample surface Ss, at least one aperture 38 arranged in the end surface S for allowing at least a part of the charged particles emitted from the sample surface Ss to enter the lens system 13 (FIG. 1) when the aperture device 31 is attached to the lens system 13 (FIG. 1). The aperture device also comprises a length axis 32 which extends through the centre of said at least one aperture 38 and is essentially perpendicular to the end surface S. The aperture device 31 also comprises at least one gas outlet 10, which is arranged at a transverse distance T perpendicular from the length axis 32, and is arranged to direct gas into a volume between the at least one aperture 38 and the sample surface Ss, wherein the end surface S within a distance, equal to ⅓ of the transverse distance T, perpendicular from the length axis 32 has a variation ΔL along the length axis 32 being smaller than ⅙ of the transverse distance T.

Preferably, the photoelectron spectrometer 1 is arranged with an end in a vacuum chamber 50 (FIG. 1), which is continuously vacuum pumped to keep the pressure in the vacuum chamber 50 considerably lower than the pressure in the volume between the at least one aperture 38 and the sample surface Ss. The aperture device 31 also comprises a gas inlet 41 for connection to the gas supply device 42 (FIG. 1). When providing a flow of pressurized gas from the gas supply device 42 to the gas inlet 41, gas will flow out of the gas outlet 10 and provide a considerably higher pressure close to the outlet 10 than the pressure in the chamber far from the gas outlet 10. The pressure in the vacuum chamber 50 may be, e.g., below 1 mbar when a pressure of between 100 mbar and 1 bar is aimed at in the volume between the at least one aperture 38 and the sample surface Ss. The pressure in the vacuum chamber 50 strongly depends on the pumping capacity of pumps that are connected to the vacuum chamber. This pressure difference will provide a steep pressure gradient from the volume between the sample surface Ss and the end surface and outwards. This pressure gradient will give rise to an flow of gas outwards from the volume between the sample surface Ss and the aperture 38. This will ensure that the gas at the sample is only the desired gas, which is introduced via the gas inlet 41. The pressure at the sample surface is dependent on the pressure of the gas in the gas inlet 10, the flow of gas in the gas inlet 10 and the shape of the volume between the at least one aperture 38 and the sample surface Ss. To be able to reach pressures close to 1 bar at the sample surface Ss below the aperture 38 it is necessary that the end surface S within a distance, equal to one third of the transverse distance T, perpendicular from the length axis 32 has a variation along the length axis ΔL being smaller than ⅙ of the transverse distance T. Another factor that effects the pressure that is possible to achieve is the distance L between the sample surface Ss and the aperture 38. A shorter distance L enables a higher pressure, when the shape of the end surface and the flow of gas from the gas inlet 10 is kept constant.

In order to reach 1 bar with as low gas flow as possible the variation ΔL, within half the transverse distance T from the length axis 32, along the length axis 32 of the end surface should be smaller than ⅒ of the transverse distance and preferably smaller than ⅟₃₀ of the transverse distance.

Also shown in FIG. 2 are the incoming x-rays, which are used for the photoemission of particles such as electrons from the sample surface Ss of the sample 33. As can be seen in FIG. 2 the possible angle of incidence of the x-rays on the sample surface Ss is limited by the shape of the aperture device and the distance L between the aperture device 31 and the sample surface Ss.

Figure 4:
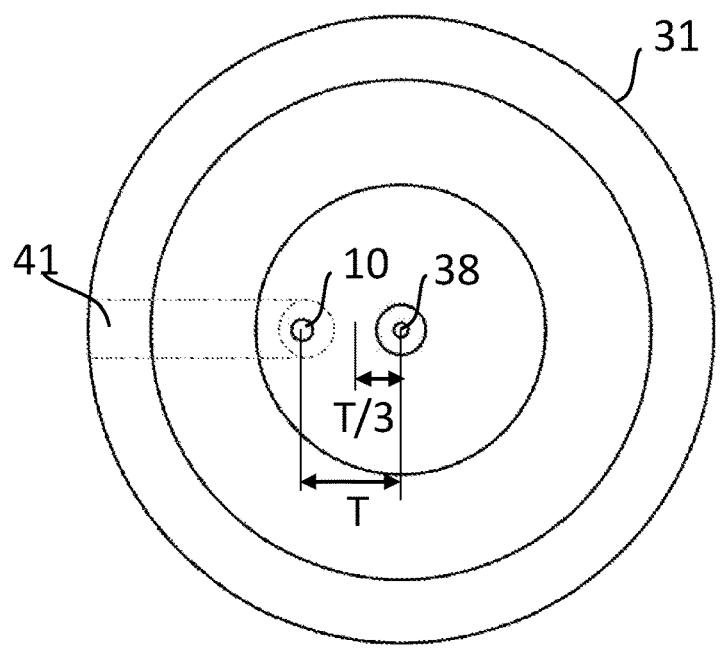
FIG. 4 is a view of the aperture device along the length axis towards the end surface of the aperture device according to an embodiment of the present invention.

FIG. 4 is a view along the length axis towards the end surface of the aperture device in FIG. 2. As can be seen in FIG. 4 the gas outlet 10 is arranged at a transverse distance T from the aperture 38. A third of the transverse distance T/3 is also indicated in FIG. 4. The gas inlet 41 is shown with dashed lines.

Figure 3:
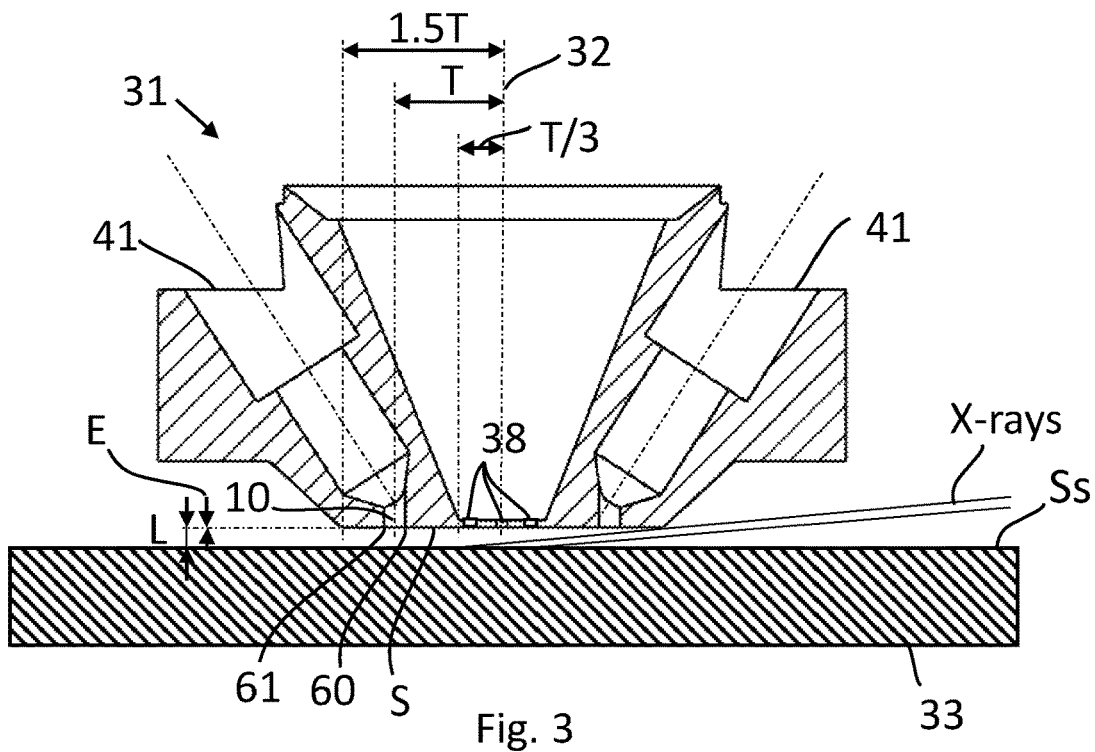
FIG. 3 shows in cross section an aperture device according to an alternative embodiment of the present invention.
Figure 6:
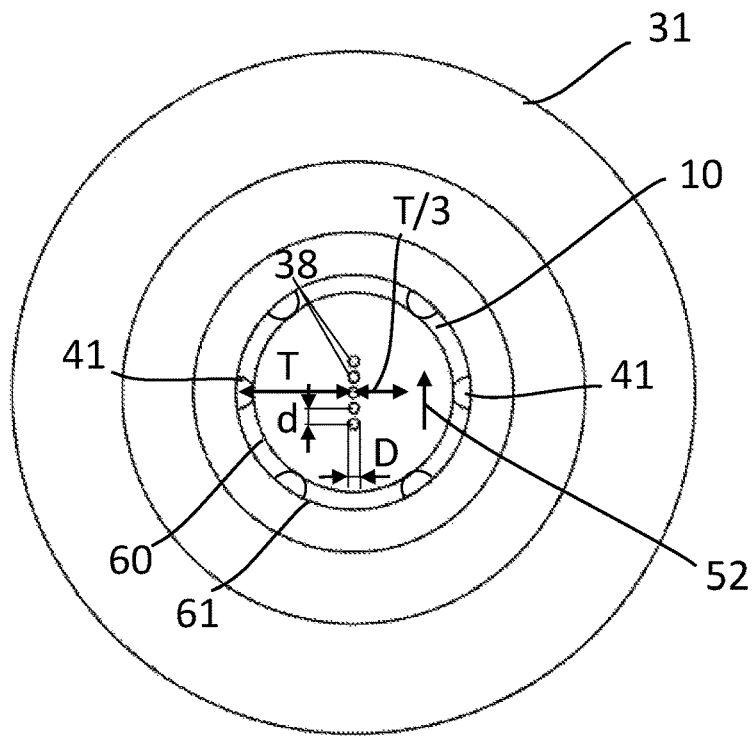
FIG. 6 is a view of along the length axis towards the end surface of the aperture device shown in FIG. 3.

FIG. 3 shows an aperture device 31 according to an alternative embodiment of the present invention. FIG. 6 is a view along the length axis towards the end surface of the aperture device shown in FIG. 3. In the embodiment shown in FIG. 3 the end surface S is essentially flat within a distance of 1.5×T from the length axis 32. This enables a high gas pressure at the sample surface below the apertures 38 without an excessive pressure in the gas outlet 10. The gas outlet 10 is ring formed as can be seen in FIG. 6. The gas outlet is connected to six gas inlets 41 which in turn are connected to the gas supply device 42, which provides pressurized gas to the sample surface Ss. This provides an even pressure distribution in the volume between the at least one aperture 38 and the sample surface Ss. The essentially flat end surface S limits the possible angle of incidence of the x-rays used for the photoemission of particles, i.e. electrons, from the sample surface Ss. This will result in an elongated form of the region on the sample surface Ss, from which charged particles are emitted. In order to enlarge the area from which charged particles may enter the lens system 13 the aperture device 31 comprises a plurality of apertures 38 arranged along a line as can be seen in FIG. 6. The line 52 along which the apertures 38 are arranged is aligned with the length axis, of the region on the sample surface, from which charged particles are emitted, which is in the left-right direction in FIG. 3. In FIG. 6 it is also shown how the gas inlets 41 are arranged in the aperture device 31. The extension of the transverse distance T and a third of the transverse distance T/3 are also illustrated in FIGS. 3 and 6. In FIG. 6 it is shown that the aperture device comprises five apertures 38 arranged along a line. Each aperture 38 is circular and has a diameter D. The apertures are arranged at a distance d from each other. According to theoretical calculations, the distance L between an aperture 38 and the sample 33 should be twice as large as the diameter D of an aperture 38. This is true for single apertures 38. However, as long as the distance d between the apertures 38 is at least 1.5, preferably 2 times the diameter of an aperture 38 the above ratio is true also for a plurality of apertures 38. With a distance d between the apertures 38 being at least 1.5 times the diameter D of the aperture 38 the so-called cross talk between the apertures 38 may be ignored, i.e. the apertures 38 do not affect each other. The diameter d of an aperture 38 can, according to an embodiment, be less than 200 µm, preferably less than 100 µm, and most preferred, less than 50 µm. When increasing the pressure at the sample surface Ss the mean free path for the electrons decreases.

The mean free path for electrons in carbon monoxide is dependent on the pressure. According to theoretical calculations the mean free path for electrons in carbon monoxide is 30 µm at a pressure of 1 bar of carbon monoxide. The diameter D of the aperture should be small to allow the aperture to be placed close to the sample while maintaining a sufficiently high pressure at the sample surface Ss. According to theoretical calculations the distance d between the aperture 38 and the sample surface Ss should be kept at twice the diameter D of the aperture to achieve a sufficiently high pressure at the sample surface Ss. The inventors have, however, discovered that even if the pressure drops at the sample surface Ss, when the sample surface Ss is arranged closer to the aperture 38 than twice the diameter D of the aperture 38 the pressure drop is predictable. Thus, a predictable pressure is achievable for distances d between the sample surface and the aperture 38 being as small as equal to the diameter D of the aperture 38. To achieve a predetermined pressure at the sample surface Ss when the aperture 38 is arranged at a distance d equal to the diameter D of the aperture 38 from the sample surface Ss, the pressure, at a distance of twice the diameter D, has to be higher than the desired pressure. For a pressure of 1 bar of carbon monoxide at the sample surface a diameter of less than 50 µm would enable a distance between the sample surface and the aperture of less than 50 µm, which would result in a reasonable number of electrons entering the aperture 38. The gas outlet is confined between an inner edge 60 and an outer edge 61. The outer edge 61 is at a distance E, along the length axis 32, from the aperture device 1 being smaller than ¼ of the transverse distance T, preferably smaller than 1/10 of the transverse distance T and most preferred smaller than 1/30 of the transverse distance T.

Figure 5:
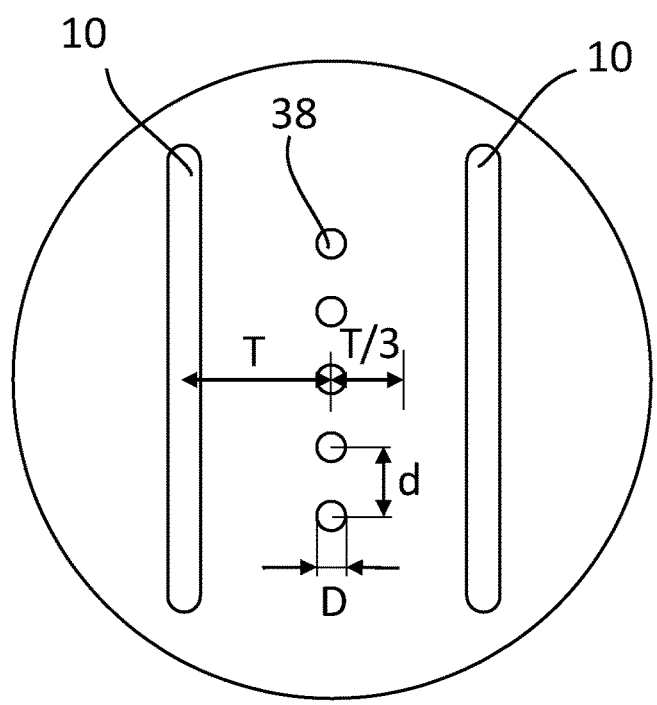
FIG. 5 is a view of the aperture device along the length axis towards the end surface of the aperture device according to an alternative embodiment of the present invention.

FIG. 5 is a view along the length axis towards the end surface of the aperture device according to an alternative embodiment of the present invention. In FIG. 5 the aperture device comprises five apertures 38 arranged along a line. Each aperture 38 is circular and has a diameter D. The apertures are arranged at a distance d from each other being two times the diameter D of the apertures for the reason discussed above. The two gas outlets 10 are formed elongated and are arranged at opposite sides of the apertures 38.

Figure 7:
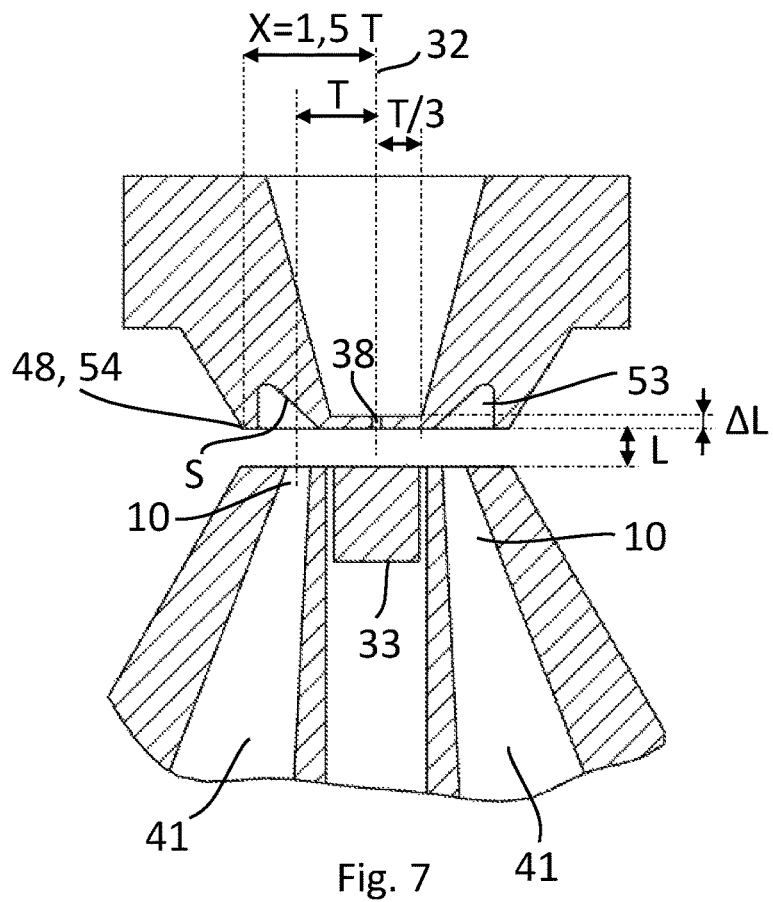
FIG. 7 is a detailed view in cross section of the aperture device according to an alternative embodiment of the present invention.

FIG. 7 is a detailed view in cross section of the aperture device 31 according to an alternative embodiment of the present invention. In contrast to the embodiment shown in FIG. 2, the gas outlet 10 is arranged opposite to the aperture 38, i.e., on the same side as the sample 33. The gas outlet 10 is ring-formed in the embodiment shown in FIG. 7. The gas inlet 41 is also ring-formed. The aperture device 38 has an end surface S, which within a distance, equal to a third of the transverse distance T, perpendicular from the length axis 32 has a variation along the length axis ΔL being smaller than ⅙ of the transverse distance T. The aperture device 31 also comprises a groove 53 encircling the aperture 38. The groove is arranged opposite to the gas outlet 10. When gas flows out of the outlet 10 it will bounce back from the groove 53 towards the sample surface Ss. A ridge 54 constitutes the outer edge of the groove 53. The ridge 54 constitutes a constriction surface 48 at a constriction distance X from the length axis. The constriction distance is approximately equal to 1.5 T in FIG. 7. The constriction surface is arranged at a larger or equal distance along the length axis 32 from the sample surface Ss compared to the distance between the aperture 38 and the sample surface Ss. As can be seen in FIG. 7 the gas outlet 10 is slightly directed towards the length axis 32.

Figure 8:
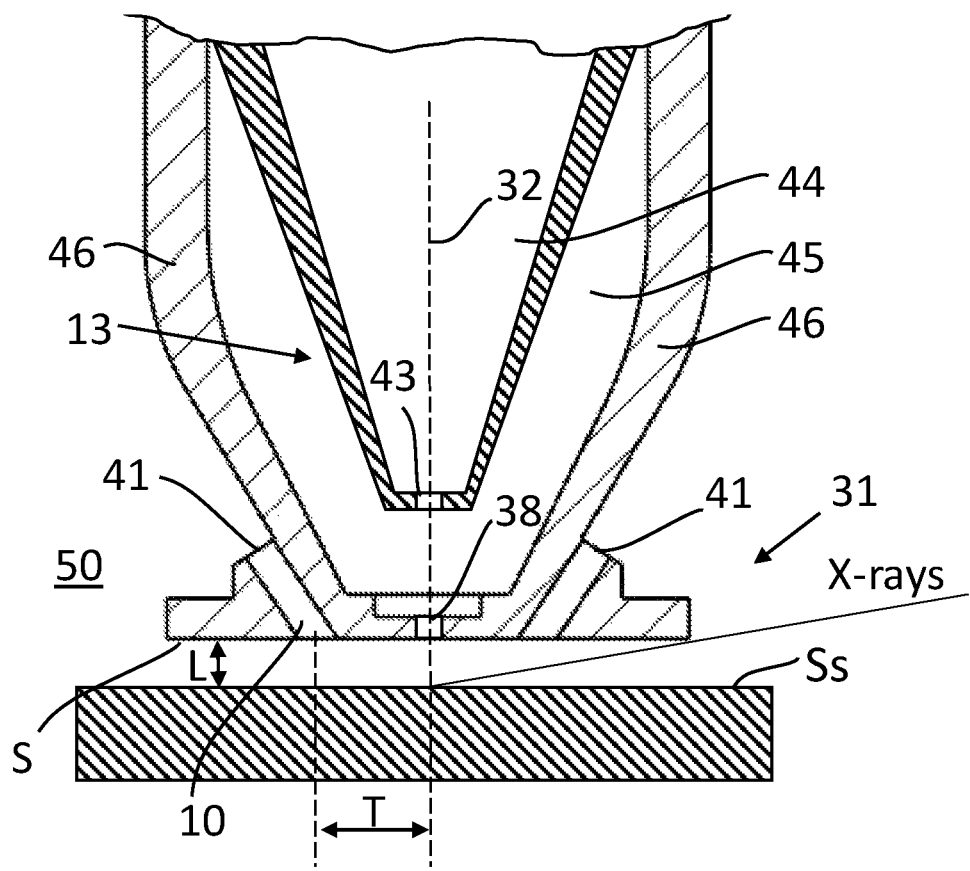
FIG. 8 shows in cross section an aperture device according to an alternative embodiment of the present invention together with the end of the lens system.

FIG. 8 shows in cross section an aperture device according to an alternative embodiment of the present invention together with the end of the lens system 13. The aperture device 31 is attached to the end of the lens system 13 by means of a connection means 46. The aperture device 31 comprises gas inlets and an aperture 38 as has been described above. The end surface S is essentially flat and is at a constant distance L from the sample surface Ss. A lens opening 43 is arranged at the end of the lens system 13. The lens opening is larger than the aperture 38. The interior volume 44 of the lens system 13 is vacuum pumped similarly to the embodiment shown in FIG. 1. A separate volume 45 is formed between the end of the lens system 13 and the aperture device 31 and is in FIG. 8 also delimited by the connection means 46. The separate volume 45 may be vacuum pumped separately from the interior volume 44 of the lens system or be vacuum pumped through the lens opening 43. The incident x-rays are shown in FIG. 8 as coming at a small angle between the sample surface and the aperture device 31. It might be possible to manufacture the entire or a part of the aperture device in a material being at least partly transparent to x-rays. An example of such a material is silicon nitride.

Figure 9:
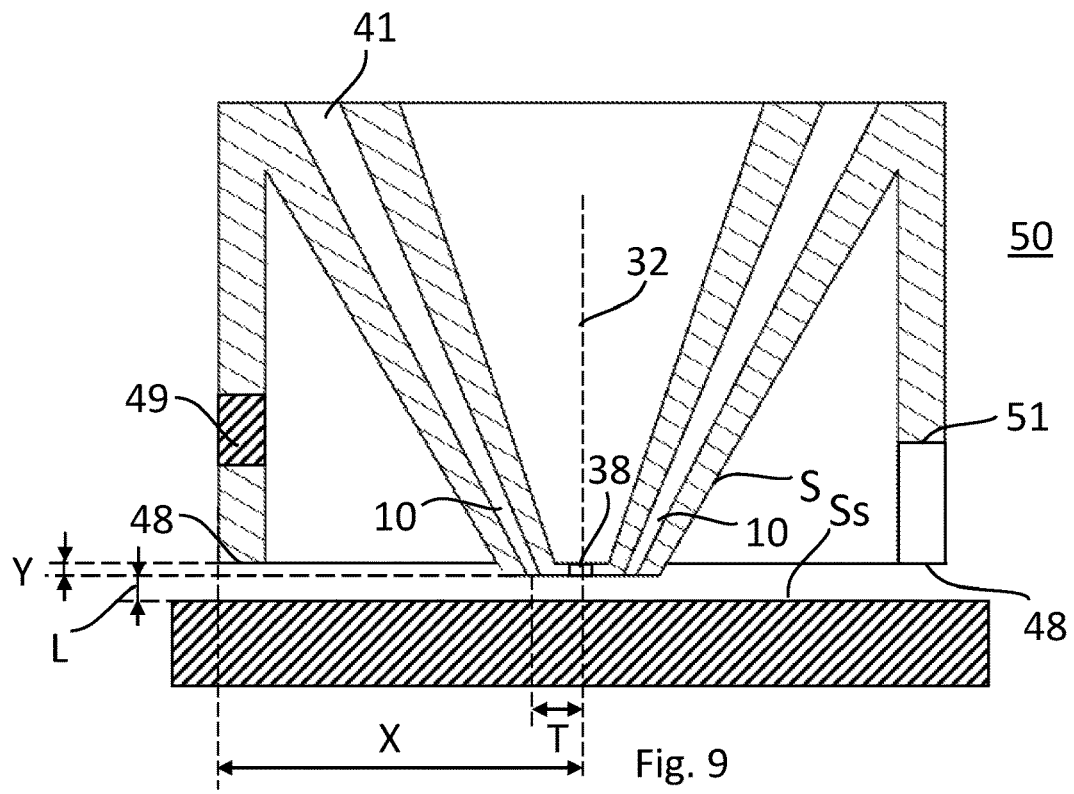
FIG. 9 shows in cross section an aperture device according to an alternative embodiment of the present invention.

FIG. 9 shows in cross section an aperture device 31 according to an alternative embodiment of the present invention. As can be clearly seen in FIG. 9 the end surface has large variation along the length axis 32. At a constriction distance X perpendicular from the length axis 32 the end surface has a constriction surface 48. In order for gas to pass from the volume between the aperture and the sample surface Ss, it has to pass the constriction surface 48. The distance between the constriction surface 48 and the sample surface Ss is larger than or equal to the distance L between the aperture and the sample surface Ss. The deviation Y of the constriction surface 48 along the length axis 32 in relation to the end surface at the aperture 38 is indicated in FIG. 9. The deviation Y is smaller than the square of the transverse distance T divided by the constriction distance X, i.e. $Y<T^2/X$, and is preferably smaller than the square of the transverse distance T divided by 10 times the constriction distance X, i.e. $Y<T^2/10X$. Thus, for larger distances the deviation should be smaller to minimize the flow area out from the high-pressure region. The constriction surface should not be closer than the aperture to the sample surface to allow the aperture to be arranged close to the sample surface. For large constriction distances X, the possible incident angle for radiation onto the sample surface Ss is limited. To enable a larger incident angle a window 49 transparent to radiation may be arranged in the aperture device 31. An alternative to a window 49 is to have a part of the constriction surface 48 farther away from the sample surface Ss than the limits defined above. This is shown by the edge 51 to the right in FIG. 9.

Figure 10:
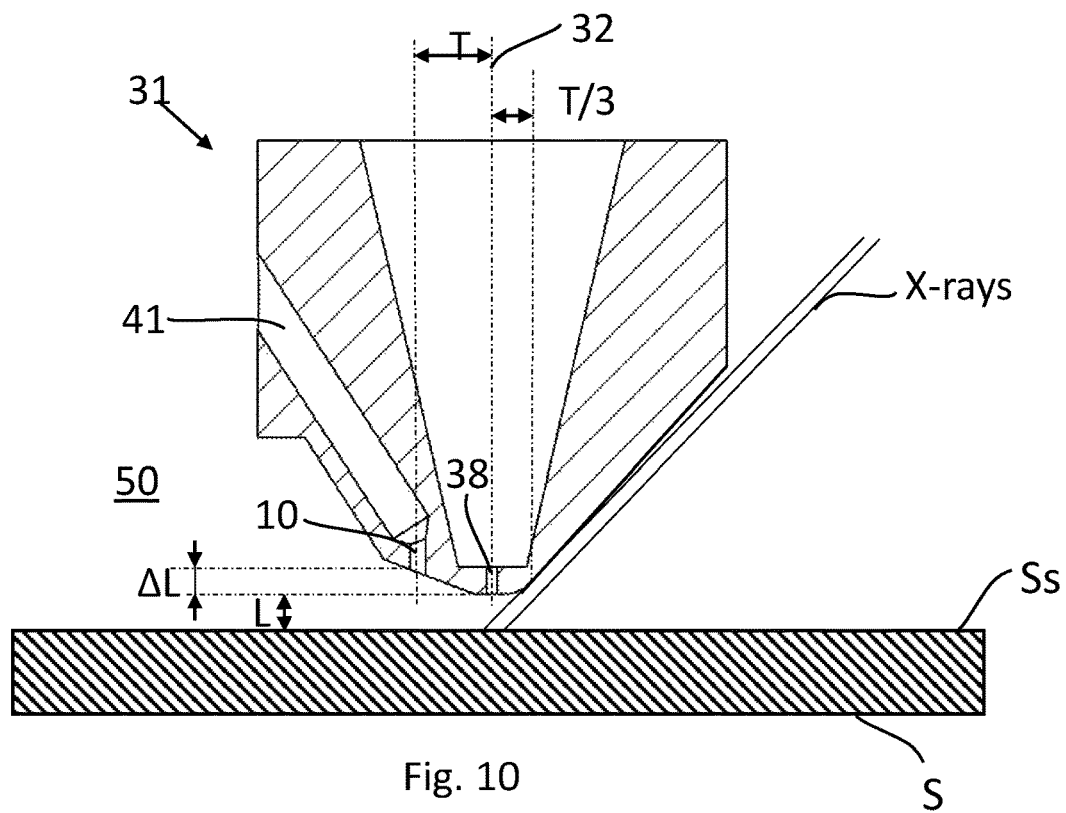
FIG. 10 shows schematically in cross section an aperture device according to an alternative embodiment of the present invention.

FIG. 10 shows schematically in cross section an aperture device 31 in FIG. 10 is similar to the aperture device 31 in FIG. 2. Only the differences between FIG. 2 and FIG. 10 will be described. To the left in FIG. 10 the end surface Ss within a distance equal to the transverse distance T, perpendicular from the length axis 32 has a variation ΔL along the length axis 32 being smaller than ¼ of the transverse distance T. This limitation ensures a sufficiently high pressure at the sample surface. To the right in FIG. 10 the end surface S does not fulfil the above limitation. This allows the x-rays to have a larger angle of incidence at the sample surface Ss. In order to maintain a sufficiently high pressure in the volume between the aperture and the sample surface the part of the end surface that does not fulfil the above limitation should not exceed 25% of the area and preferably not exceed 10% of the area.

The above described embodiments may be amended in many ways without departing from the scope of the invention, which is limited only by the appended claims.

The invention claimed is:

1. An aperture device attachable to a lens system, comprising a first end, and a second end at a distance from the first end, wherein the lens system is arranged to form a particle beam of charged particles, emitted from a sample surface of a particle emitting sample, which enter the lens system at the first end and to transport the charged particles to the second end,
wherein the aperture device comprises
an end surface which is to be arranged facing the sample surface,
at least one aperture arranged in the end surface for allowing at least a part of said particles to enter the lens system when the aperture device is attached to the lens system, and
a length axis which extends through the centre of said at least one aperture and is essentially perpendicular to the end surface,
characterized in that the aperture device further comprises
at least one gas outlet, which is arranged at a transverse distance perpendicular from the length axis, and is arranged to direct gas into a volume between the at least one aperture and the sample surface,
wherein the aperture device, within a distance of less than 10 times the transverse distance, perpendicular from the length axis, comprises gas flow constriction surface, to constrain the flow of gas from the volume between the at least one aperture and the sample surface and the gas flow constriction surface encircles the at least one gas outlet and the at least one aperture.

2. The aperture device according to claim 1, wherein the constriction surface is arranged in the end surface and is at a constriction distance perpendicular from the length axis, wherein at least 75% of the constriction surface has a deviation along the length axis in relation to the end surface at the at least one aperture being smaller than
the square of the transverse distance divided by the constriction distance.

3. The aperture device according to claim 2, wherein the constriction distance is smaller than 2 times the transverse distance.

4. The aperture device according to claim 1, wherein the constriction surface is arranged in the end surface and comprises the form of the end surface, which within a distance equal to ⅓ of the transverse distance, perpendicular from the length axis, has a variation along the length axis being smaller than ⅙ of the transverse distance.

5. The aperture device according to claim 1, wherein said at least one gas outlet is arranged in the end surface.

6. The aperture device according to claim 1, wherein the end surface within a distance, equal to ⅓ of the transverse distance perpendicular from the length axis has a variation along the length axis being smaller than ¼ of the transverse distance.

7. The aperture device according to claim 1, wherein the end surface in at least 75% of the area that is within a distance equal to the transverse distance, perpendicular from the length axis has a variation along the length axis being smaller than ¼ of the transverse distance.

8. The aperture device according to claim 1, comprising a number of gas outlets.

9. The aperture device according to claim 8, wherein the gas outlets are symmetrically arranged around said at least one aperture, seen in along the length axis.

10. The aperture device according to claim 1, comprising only one gas outlet which surrounds said at least one aperture, seen along the length axis.

11. The aperture device according to claim 10, wherein the gas outlet is confined between an inner edge and an outer edge, wherein the outer edge is at a distance along the length axis from the aperture device being smaller than ¼ of the transverse distance.

12. The aperture device according to claim 1, wherein a number of apertures are arranged in the end surface and the length axis extends essentially centred in relation to the apertures.

13. The aperture device according to claim 1, wherein each one of the at least one aperture is essentially circular.

14. The aperture device according to claim 12, wherein the ratio between the distance between adjacent apertures and the diameter of an aperture is more than 1.5.

15. The aperture device according to claim 12, wherein the diameter of an aperture is less than 200 μm.

16. An analyser arrangement for determining at least one parameter related to charged particles emitted from a particle emitting sample, comprising:
 a measurement region comprising an entrance allowing at least a part of said particles to enter the measurement region;
 a lens system comprising a first end, and a second end arranged at the entrance of the measurement region at a distance from the first end, wherein the lens system is arranged to form a particle beam from charged particles, emitted from a sample surface of a particle emitting sample, which enter at the first end and to transport the charged particles to the second end, and
 an aperture device according to claim 1, attached to the lens system.

17. The analyser arrangement according to claim 16, also comprising a chamber surrounding the first end of the lens system and the aperture device and in which the sample is to be arranged and a vacuum pump for pumping vacuum in the chamber.

18. A method for forming a high pressure between an aperture to a lens system and a sample surface of a particle emitting sample, the lens system comprising a first end at which the aperture is arranged, and a second end at a distance from the first end, wherein the lens system is arranged to form a particle beam of charged particles, emitted from the sample surface, which enter at the first end and to transport the charged particles to the second end,
 wherein the method comprises the steps of
 providing an aperture device, which is attachable to the lens system and comprises an end surface, an aperture arranged in the end surface, a length axis, which extends through the centre of said at least one aperture and is essentially perpendicular to the end surface,
 wherein the method is characterized in that it comprises the steps of
 providing at least one gas outlet at a transverse distance perpendicular from the length axis, being arranged to direct gas into a volume between the at least one aperture and the sample surface,
 attaching the aperture device to the lens system with the end surface facing the sample surface, to allow at least a part of said particles to enter the lens system,
 arranging the sample, the aperture device, and the first end of the lens system, in a chamber and pumping vacuum in the chamber, and
 providing a flow of gas from the at least one gas outlet,
 wherein the aperture device within a distance of less than 10 times the transverse distance, perpendicular from the length axis comprises gas flow constriction surface, to constrain the flow of gas from the volume between the at least one aperture and the sample surface and the gas flow constriction surface encircles the at least one gas outlet and the at least one aperture.

19. The method according to claim 18, wherein the sample surface is arranged at a distance from the end surface of less than 300 μm.

20. The aperture device according to claim 2, wherein at least 75% of the constriction surface has a deviation along the length axis in relation to the end surface at the at least one aperture being smaller than
 the square of the transverse distance divided by 10 times the constriction distance.

* * * * *